US008508458B2

(12) United States Patent
Han et al.

(10) Patent No.: US 8,508,458 B2
(45) Date of Patent: Aug. 13, 2013

(54) ARRAY SUBSTRATE AND SHIFT REGISTER

(75) Inventors: Seung Woo Han, Beijing (CN);
Guangliang Shang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 309 days.

(21) Appl. No.: 12/976,060

(22) Filed: Dec. 22, 2010

(65) Prior Publication Data

US 2011/0156997 A1 Jun. 30, 2011

(30) Foreign Application Priority Data

Dec. 24, 2009 (CN) .......................... 2009 1 0244002

(51) Int. Cl.
*G09G 3/36* (2006.01)

(52) U.S. Cl.
USPC .............................. 345/100; 345/204; 377/64

(58) Field of Classification Search
USPC .................. 345/87, 92, 100, 204; 377/64–81
See application file for complete search history.

(56) References Cited

U.S. PATENT DOCUMENTS

| 7,548,228 | B2 * | 6/2009 | Pak et al. ....................... 345/100 |
| 2006/0044247 | A1 * | 3/2006 | Jang et al. ....................... 345/98 |
| 2006/0267911 | A1 * | 11/2006 | Jang ............................... 345/100 |
| 2007/0075960 | A1 * | 4/2007 | Ito .................................... 345/98 |
| 2007/0229441 | A1 * | 10/2007 | Liu et al. ....................... 345/100 |
| 2008/0174580 | A1 * | 7/2008 | Chang et al. ................... 345/205 |
| 2009/0009454 | A1 * | 1/2009 | Urisu .............................. 345/87 |

FOREIGN PATENT DOCUMENTS

CN 102023426 A 4/2011

* cited by examiner

*Primary Examiner* — Koosha Sharifi-Tafreshi
(74) *Attorney, Agent, or Firm* — Ladas & Parry LLP

(57) ABSTRACT

An array substrate and a shift register directly fabricated thereon are provided. The shift register comprises a plurality of shift register units each connected to respective one of gate lines of the array substrate. The plurality of shift register units are divided into three groups. As to any two adjacent shift register units of each group, a signal output terminal of the following shift register unit is connected to a reset signal input terminal of the preceding shift register unit, and a signal output terminal of the preceding shift register unit is connected to a start voltage timing signal input terminal of the following shift register unit. Each group of shift register units are controlled by two clock signals, and the two clock signals alternately control two adjacent shift register units of each group. Both the first shift register unit and the third shift register unit are connected to a first start voltage timing signal input terminal, and the second shift register unit is connected to a second start voltage timing signal input terminal.

8 Claims, 3 Drawing Sheets

ARRAY SUBSTRATE AND SHIFT REGISTER

BACKGROUND

Embodiments of the present invention relate to an array substrate of a liquid crystal display (LCD) and a shift register that is capable of being directly fabricated on an array substrate.

Liquid crystal displays have become the mainstream of flat panel displays and each generally comprises an array substrate and a color filter substrate, which are disposed opposite to each other, with a liquid crystal layer being interposed between the two substrates. On the array substrate, a plurality of gate lines and a plurality of data lines intersecting with each other are formed to define a plurality of pixels. Each pixel may comprise a switching element, such as a thin film transistor (TFT), to determine the gray level when the pixel displays. More specifically, the switching element of each pixel is controlled by the corresponding gate line to determine whether or not data signals from the corresponding data line can be supplied to a pixel electrode of the pixel, and the gray level when the pixel displays is determined depending on a voltage applied to the pixel electrode. Gate lines are controlled by a gate driver, and data lines are controlled by a source driver. Conventionally, a gate driver chip is attached to a flexible printed circuit board (Chip on Film), or is directly attached to a glass substrate (Chip on Glass). During displaying, the row-by-row scanning is performed on gate lines to input one frame of image.

SUMMARY

An embodiment provides a shift register on an array substrate, comprising: a plurality of shift register units each connected to respective one of gate lines of the array substrate, wherein the plurality of shift register units are divided into three groups: a first group comprising the ($8n+1$)th and ($8n+5$)th shift register units corresponding to the ($8n+1$)th and ($8n+5$)th gate lines, a second group comprising the ($8n+3$)th and ($8n+7$)th shift register units corresponding to the ($8n+3$)th and ($8n+7$)th gate lines, and a third group comprising the ($8n+2$)th, ($8n+4$)th, ($8n+6$)th and ($8n+8$)th shift register units corresponding to the ($8n+2$)th, ($8n+4$)th, ($8n+6$)th and ($8n+8$)th gate lines, where n is 0 or a positive integer; wherein as to any two adjacent shift register units of each group, a signal output terminal of the following shift register unit is connected to a reset signal input terminal of the preceding shift register unit, and a signal output terminal of the preceding shift register unit is connected to a start voltage timing signal input terminal of the following shift register unit; wherein each group of shift register units are controlled by two clock signals, and the two clock signals alternately control two adjacent shift register units of each group; and wherein both the first shift register unit and the third shift register unit are connected to a first start voltage timing signal input terminal, and the second shift register unit is connected to a second start voltage timing signal input terminal.

Another embodiment provides an array substrate on which the above shift register is formed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Figure 1:
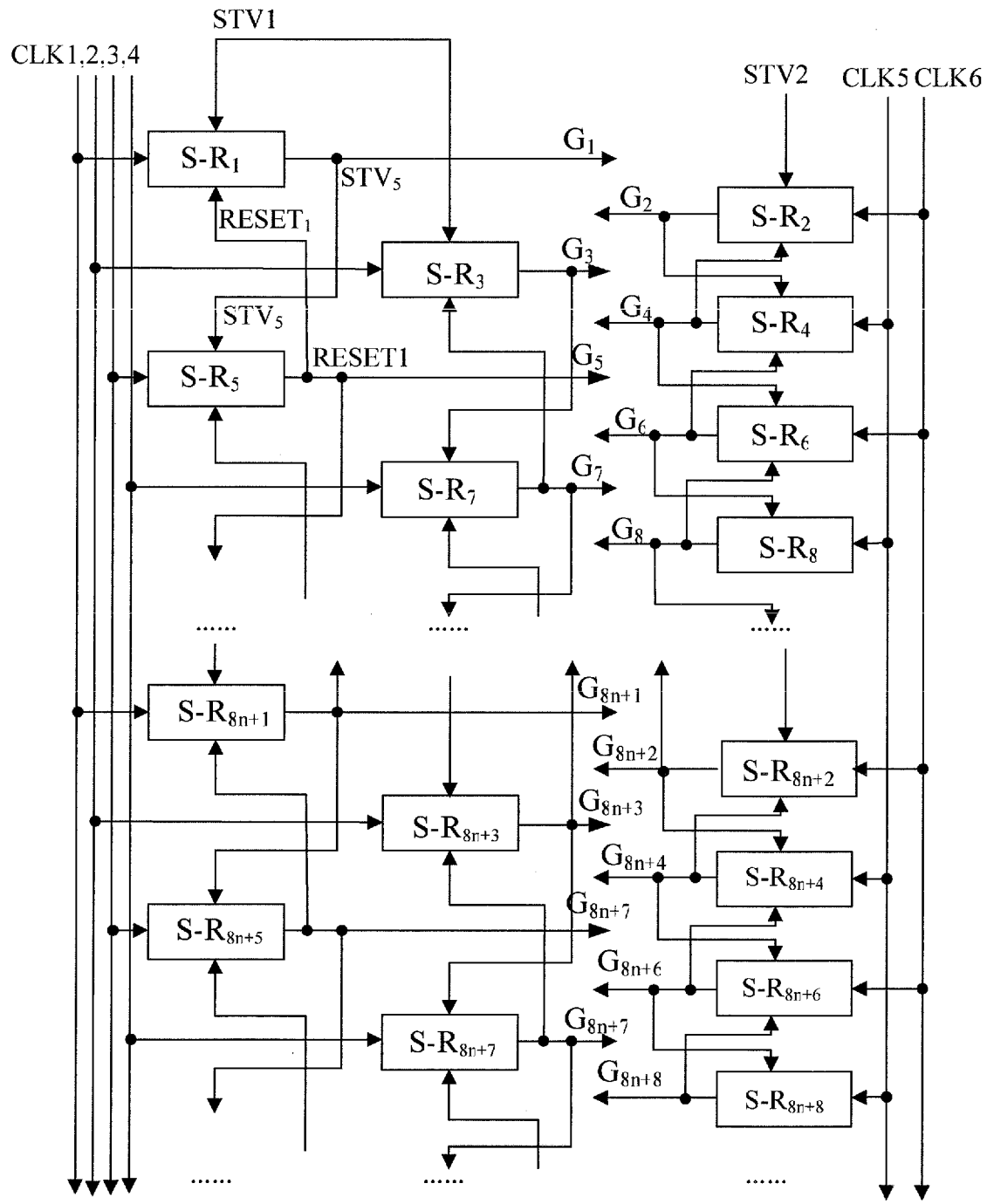
FIG. 1 is a block diagram of a shift register comprising shift register units according to an embodiment.
Figure 2:
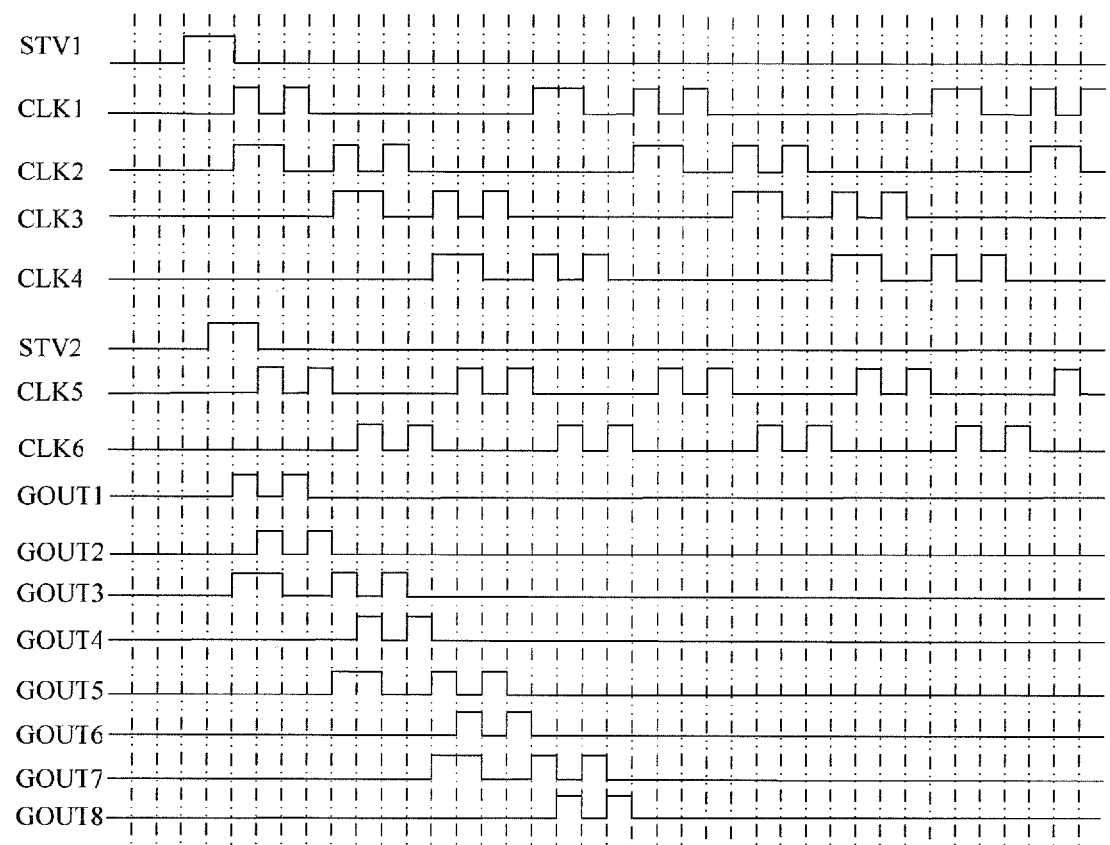
FIG. 2 is a timing sequence diagram of output signals according to the embodiment.

FIG. 1 is a block diagram of a shift register comprising shift register units according to an embodiment of an embodiment, and FIG. 2 is a timing sequence diagram of output signals according to the embodiment. As shown in FIGS. 1 and 2, the embodiment provides a shift register that can be directly formed on an array substrate and comprises a plurality of shift register units; each of the shift register units in the shift register is connected to respective one of the gate lines of the array substrate. The shift register units of the shift register are divided into three groups: a first group comprising the ($8n+1$)th and ($8n+5$)th shift register units corresponding to the ($8n+1$)th and ($8n+5$)th gate lines, a second group comprising the ($8n+3$)th and ($8n+7$)th shift register units corresponding to the ($8n+3$)th and ($8n+7$)th gate lines, and a third group comprising the ($8n+2$)th, ($8n+4$)th, ($8n+6$)th and ($8n+8$)th shift register units corresponding to the ($8n+2$)th, ($8n+4$)th, ($8n+6$)th and ($8n+8$)th gate lines, wherein n is 0 or a positive integer.

With reference to FIG. 1, the first group of shift register units comprise shift register units S-R1, S-R5, S-R9, S-R14 . . . ; the second group of shift register units comprise shift register units S-R3, S-R7, S-R11, S-R15 . . . ; and the third group of shift register units comprise shift register units S-R2, S-R4, S-R6, S-R8, S-R10, S-R12, S-R14, S-R16 . . . . The shift register units S-R1, S-R5, S-R9, S-R14 . . . are respectively connected with the gate lines G1, G5, G9, G14 . . . ; the shift register units S-R3, S-R7, S-R11, S-R15 . . . are respectively connected with the gate lines G3, G7, G11, G15 . . . ; the shift register units S-R2, S-R4, S-R6, S-R8, S-R10, S-R12, S-R14, S-R16 . . . are respectively connected with the gate lines G2, G4, G6, G8, G10, G12, G14, G16 . . . . The plurality of shift register units as shown in FIG. 1 are provided on the array substrate repeatedly corresponding to the gate lines.

As to two adjacent shift register units in each group of shift register units, a signal output terminal of the following shift register unit is connected to a reset signal input terminal of the preceding shift register unit, and a start voltage timing signal input terminal of the following shift register unit is connected to a signal output terminal of the preceding shift register unit, that is, an output signal of the preceding shift register is a start voltage timing signal of the following shift register unit, and an output signal of the following shift register is a reset signal of the preceding shift register unit.

For example, in the first group of shift register units, the output signal of the first shift register unit S-R1 is the start voltage timing signal STV5 for the fifth shift register unit S-R5, the output signal of the fifth shift register unit S-R5 is the reset signal RESET1 for the first shift register unit S-R1, and so on. In the second group of shift register units, the output signal of the third shift register unit S-R3 is the start voltage timing signal for the seventh shift register unit S-R7, the output signal of the seven shift register unit S-R7 is the reset signal for the third shift register unit S-R3, and so on. In the third group of shift register units, the output signal of the second shift register unit S-R2 is the start voltage timing signal for the fourth shift register unit S-R4, and the output signal of the fourth shift register unit S-R4 is the reset signal for the second shift register unit S-R2, and so on.

In addition, both STV1 signal and STV2 signal are start voltage timing signals, and STV1 signal is only inputted into the first shift register unit S-R1 and the third shift register unit S-R3, and STV2 signal is only inputted into the second shift register unit S-R2.

Each group of the shift register units of the shift register of the embodiment are controlled by two clock signals, and the two clock signals alternately control two adjacent shift register units in each group. For example, the first group of shift register units corresponding to the $(8n+1)$th and $(8n+5)$th gate lines are alternately controlled by a first clock signal CLK1 and a third clock signal CLK3, that is, the shift register units S-R1, S-R9 . . . are controlled by the first clock signal CLK1, and the shift register units S-R5, S-R13 . . . are controlled by the third clock signal CLK3. The second group of shift register units corresponding to the $(8n+3)$th and $(8n+7)$th gate lines are alternately controlled by a second clock signal CLK2 and a fourth clock signal CLK4, that is, the shift register unit S-R3, S-R11 . . . are controlled by the second clock signal CLK2, and the shift register unit S-R7, S-R15 . . . are controlled by the fourth clock signal CLK4. The third group of shift register units corresponding to the $(8n+2)$th, $(8n+4)$th, $(8n+6)$th and $(8n+8)$th gate lines are alternately controlled by a fifth clock signal CLK5 and a sixth clock signal CLK6, that is, the shift register units S-R2, S-R6, S-R10, S-R14 . . . are controlled by the six clock signal CLK6, and the shift register units S-R4, S-R8, S-R12, S-R16 . . . are controlled by the fifth clock signal CLK5.

Figure 3:
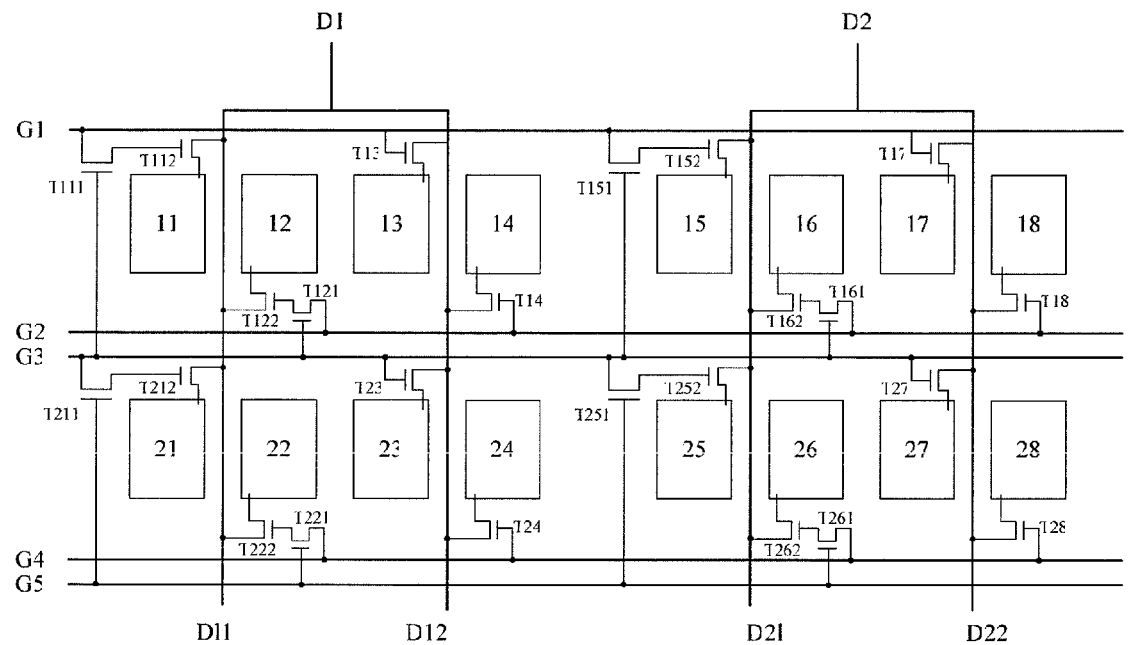
FIG. 3 is a schematic view showing the pixel structure of an array substrate of a liquid crystal display according to an embodiment.

FIG. 3 is a schematic view showing the pixel structure of an array substrate of a liquid crystal display according to an embodiment. As shown in FIG. 3, the array substrate comprises a plurality of gate lines for supplying driving signals and a plurality of data lines for supplying image signals. These gate lines and the data lines intersect with each other to define a plurality of pixels.

More specifically, the array substrate comprises a first gate line G1, a second gate line G2, a third gate line G3, a fourth gate line G4, a fifth gate line G5 . . . and so forth, extending along a transverse direction. A first pixel 11, a second pixel 12, a third pixel 13, a fourth pixel 14, a fifth pixel 15, a sixth pixel 16, a seventh pixel 17, a eighth pixel 18 and the like at the first row are disposed along the transverse direction between the first gate line G1 and the second gate line G2 in this order; a first pixel 21, a second pixel 22, a third pixel 23, a fourth pixel 24, a fifth pixel 25, a sixth pixel 26, a seventh pixel 27, a eighth pixel 28 and the like at the second row are disposed along the transverse direction between the third gate line G3 and the fourth gate line G4 in this order. A first branch-data line D11 and a second branch-data line D12 are branched from a first data line D1 connected to one data integral circuit, and the first branch-data line D11 extends in the vertical direction between the first pixel 11 and the second pixel 12 and the second branch-data line D12 extends in the vertical direction between the third pixel 13 and the fourth pixel 14.

The first pixel 11 at the first row comprises a first switching device that allows image signals from the first branch-data line D11 to be inputted into the first pixel only when the first gate line G1 and the third gate line G3 provide simultaneously high level driving signals, and the first switching device for the first pixel is electrically connected to the first gate line G1, the third gate line G3 and the first branch-data line D11; the second pixel 12 at the first row comprises a second switching device that allows image signals from the first branch-data line D11 to be inputted into the second pixel only when the second gate line G2 and the third gate line G3 provide simultaneously high level driving signals, and the second switching device is electrically connected to the second gate line G2, the third gate line G3 and the first branch-data line D11; the third pixel 13 at the first row comprises a third switching device that allows image signals from the second branch-data line D12 to be inputted into the third pixel only when the first gate line G1 provides high level driving signal, and the third switching device is electrically connected to the first gate line G1and the second branch-data line D12; the fourth pixel 14 at the first row comprises a fourth switching device that allows image signals from the second branch-data line D12 to be inputted into the fourth pixel only when the second gate line G2 provides high level driving signal, and the fourth switching device is electrically connected to the second gate line G2 and the second branch-data line D12.

The charging processes for other pixels, such as the pixel 15, the pixel 16, the pixel 17 and the pixel 18 at the first row and the pixel 21, the pixel 22, the pixel 23 and the pixel 24 at the second row are substantially identical with those for the first pixel 11, the second pixel 12, the third pixel 13 and the fourth pixel 14 at the first row and are not described herein for simplicity.

In the embodiment, for example, the first switching device, the second switching device, a fifth switching device and a sixth switching device for the pixels 11, 12, and 16 at the first row and a first switching device, a second switching device, a fifth switching device and a sixth switching device for the pixels 21, 22, 25, and 26 at the second row each may comprise a plurality of thin film transistors; the third switching device, the fourth switching device, a seventh switching device and a eighth switching device for the pixels 13, 14, 17 and 18 at the first row and the third switching device, the fourth switching device, a seventh switching device and a eighth switching device for the pixels 23, 24, 27 and 28 at the second row each may comprise one thin film transistor. However, the present invention is not limited to the above configuration.

Although in the FIG. 3, the group comprising the first pixel, the second pixel, the third pixel and the fourth pixel are arranged repeatedly, e.g., the group comprising the fifth pixel, the sixth pixel, the seventh pixel and the eighth pixel is arranged in the same way. However, the structure of the switching device may be modified as necessary, for example, the first pixel and the third pixel can be exchanged; or the second pixel and the fourth pixel can be exchanged. Of course, if the order of the pixels is changed, the order of data transmitted over data lines is adjusted correspondingly.

In summary, the array substrate comprises i gate lines and j data lines, and two branch-data lines Dj1 and Dj2 are branched from each data line, where i and j both are positive integers. Pixels at the i-th row are formed between the gate lines $2i-1$ and $2i$. Each data line j defines four pixels at the i-th row, comprising pixels $i(4j-3)$ and $i(4j-2)$ corresponding to the branch-data line Dj1 and pixels i(4j−1) and i(4j) corresponding to the branch-data line Dj2.

The pixel i(4j−3) comprises a first switching device that allows image signals from the branch-data line Dj1 to be inputted into this pixel only when the gate line 2i−1 and the gate line 2i+1 provide simultaneously high level driving signals, and the first switching device for this pixel is electrically connected to the gate line 2i−1, the gate line 2i+1 and the branch-data line Dj1; the pixel i(4j−2) comprises a second switching device that allows image signals from the branch-data line Dj1 to be inputted into this pixel only when the gate line 2i and the gate line 2i+1 provide simultaneously high level driving signals, and the second switching device is electrically connected to the gate line 2i, the gate line 2i+1 and the branch-data line Dj1; the pixel i(4j−1) comprises a third switching device that allows image signals from the branch-data line Dj2 to be inputted into this pixel only when the gate line 2i−1 provides high level driving signal, and the third switching device is electrically connected to the gate line 2i−1 and the branch-data line Dj2; the pixel i(4j) at the first row comprises a fourth switching device that allows image signals from the branch-data line Dj2 to be inputted into this pixel only when the gate line 2i provides high level driving signal, and the fourth switching device is electrically connected to the gate line 2i and the branch-data line Dj2.

As shown in FIG. 3, in the embodiment, the first switching device of the first pixel 11 at the first row comprises a first sub-thin film transistor T111 and a second sub-thin film transistor T112 for the first pixel. A gate of the first sub-thin film transistor T111 is electrically connected to the third gate line G3, a source thereof is electrically connected to the first gate line G1, and a drain thereof is electrically connected to a gate of the second sub-thin film transistor T112; and a source of the second sub-thin film transistor T112 is electrically connected to the first branch-data line D11 and a drain thereof is electrically connected to the pixel electrode of the first pixel at the first row.

As shown in FIG. 3, in the embodiment, the second switching device for the second pixel 12 at the first row comprises a first sub-thin film transistor T121 and a second sub-thin film transistor T122. A gate of the first sub-thin film transistor T121 is electrically connected to the third gate line G3, a source thereof is electrically connected to the second gate line G2, and a drain thereof is electrically connected to a gate of the second sub-thin film transistor T122; and a source of the second sub-thin film transistor T122 is electrically connected with the first branch-data line, and a drain thereof is electrically connected with the pixel electrode of the second pixel 12 at the first row.

As shown in FIG. 3, in the embodiment, the third switching device for the third pixel 13 at the first row comprises a first thin film transistor T13. A gate of the first thin film transistor T13 for the third pixel 13 at the first row is electrically connected with the first gate line G1, a source thereof is electrically connected with the second branch-data line D12, and a drain thereof is electrically connected to the pixel electrode of the third pixel 13 at the first TOW.

As shown in FIG. 3, in the embodiment, the fourth switching device for the fourth pixel 14 at the first row comprises a first thin film transistor T14. A gate of the first thin film transistor T14 for the fourth pixel 14 at the first row is electrically connected to the second gate line G2, a source thereof is electrically connected to the second branch-data line D12, and a drain thereof is electrically connected to the pixel electrode of the fourth pixel 14 at the first row.

The switching devices for pixels 15, 16, 17 and 18 are same as those for the first to fourth pixels 11~14 at the first row, and the electrical connections thereof are shown in FIG. 3 and are not described here for simplicity.

Hereinafter, a driving method of a liquid crystal display according to the embodiment will be explained with reference to FIGS. 1 to 3. The following description is made with respect to only one shift register of the embodiment.

When STV1 is inputted into the first shift register unit S-R1 and the third shift register unit S-R3, the first shift register unit S-R1 and the third shift register unit S-R3 are started up; after one clock period (in FIG. 2, a time interval between every two double dot-dash-lines is defined as one clock period), STV2 is inputted into the second shift register unit S-R2, and the second shift register unit S-R2 is started up. Hereinafter, a clock period when the first clock signal CLK1 is at the high level is referred to a first clock period, and then the immediately next one clock period is referred to a second clock period . . . and so on.

The first clock period. The first clock signal CLK1 and the second clock signal CLK2 are respectively inputted into the first shift register unit S-R1 and the third shift register unit S-R3, and signal GOUT1 and signal GOUT3 are respectively applied to the first gate line G1 and the third gate line G3. At this time, the first sub-thin film transistor T111 connected to the third gate line G3 for the first pixel 11 at the first row is turned on, and signal GOUT1 over the first gate line G1 is transferred to the gate of the second sub-thin film transistor T112 for the first pixel 11 at the first row, and the second sub-thin film transistor T112 is thereby turned on, so that the first pixel 11 at the first row receives image signals from the data line D11.

The second clock period. The second clock signal CLK2 and the fifth clock signal CLK5 are respectively inputted into the third shift register unit S-R3 and the second shift register unit S-R2, and signal GOUT3 and signal GOUT2 are respectively applied to the third gate line G3 and the second gate line G2. At this time, the first sub-thin film transistor T121 connected to the third gate line G3 for the second pixel 12 at the first row is turned on, and signal GOUT2 over the second gate line G2 is transferred to the gate of the second sub-thin film transistor T122 for the second pixel 12 at the first row, and the second sub-thin film transistor T122 is turned on, so that the second pixel 12 at the first row receives image signals from the data line D11.

The third clock period. The first clock signal CLK1 is inputted into the first shift register unit S-R1, and signal GOUT1 is applied to the first gate line G1. At this time, the first thin film transistor T13 for the third pixel 13 at the first row is turned on, so that the third pixel 13 at the first row receives image signals from the data line D12.

The fourth clock period. The fifth clock signal CLK5 is inputted into the second shift register unit S-R2, and signal GOUT2 is applied to the second gate line G2. At this time, the first thin film transistor T14 connected to the second gate line G2 for the fourth pixel 14 at the first row is turned on, so that the fourth pixel 14 at the first row receives image signals from the data line D12.

The above-mentioned operations are performed to sequentially input signals into pixels at the first row comprising the first pixel 11, the second pixel 12, the third pixel 13 and the fourth pixel 14, and the scanning for the first row ends here.

The fifth clock period. The third clock signal CLK3 and the second clock signal CLK2 are respectively inputted into the fifth shift register unit S-R5 and the third shift register unit S-R3, and signal GOUT5 and signal GOUT3 are respectively applied to the fifth gate line G5 and the third gate line G3. At this time, the first sub-thin film transistor T211 connected to the fifth gate line G5 for the first pixel 21 at the second row is turned on, signal GOUT3 is transferred from the third gate line G3 to the gate of the second sub-thin film transistor T212 for the first pixel 21 at the second row, and the second sub-thin film transistor T212 is turned on, so that the first pixel 21 at the second row receives image signals from the data line D11.

The sixth clock period. The third clock signal CLK3 and the sixth clock signal CLK6 are respectively inputted into the fifth shift register unit S-R5 and the fourth shift register unit S-R4, and signal GOUT5 and signal GOUT4 are respectively applied to the fifth gate line G5 and the fourth gate line G4. At this time, the first sub-thin film transistor T221 connected to the fifth gate line G5 for the second pixel 22 at the second row is turned on, and signal GOUT4 is transferred from the fourth gate line G4 to the gate of the second sub-thin film transistor T222 for the second pixel 22 at the second row, and the second sub-thin film transistor T222 is turned on, so that the second pixel 22 at the second row receives image signal from the data line D11.

The seventh clock period. The second clock signal CLK2 is inputted into the third shift register unit S-R3, and signal GOUT3 is applied to the third gate line G3. At this time, a first thin film transistor T23 connected to the third gate line G3 for the third pixel 23 at the second row is turned on, so that the third pixel 23 at the second row receives image signals from the data line D12.

The eighth clock period. The sixth clock signal CLK6 is inputted into the fourth shift register unit S-R4, and signal GOUT4 is outputted to the fourth gate line G4. At this time, a first thin film transistor T24 connected to the fourth gate line G4 for the fourth pixel 24 at the second row is turned on, so that the fourth pixel 24 at the second row receives image signals from the data line D12.

The above-mentioned operations are performed to sequentially input signals into pixels at the second row in which the first pixel 21, the second pixel 22, the third pixel 23 and the fourth pixel 24 are comprised, and the scanning for the second row ends here.

The charging processes for other pixels, such as, the pixels 15, 16, 17, and 18, are identical with those for the pixels 11, 12, 13 and 14, so the detailed description is omitted for simplicity.

It should be pointed out that, during the first clock period, the first thin film transistor T13 for the third pixel 13 at the first row and the first thin film transistor T23 for the third pixel 23 at the second row are both turned on also, and thus, during this clock period, the third pixel 13 at the first row and the third pixel 23 at the second row receive the same image signals as the first pixel 11 at the first row. Then, during the third clock period, the first thin film transistor T13 for the third pixel 13 at the first row is again turned on and receives image signals. As to the third pixel at the first row, during the third clock period, image signals inputted during the first clock period are rapidly replaced with image signals inputted in the third clock period, and thus, before a user perceives image point displayed at the third pixel at the first row in the first clock period, the image point in the third clock period has been displayed. Because during a process of scanning the pixels at the first row (for displaying one image frame), the third pixel does not receive any new image signals from the data line, before the next scanning for the pixels at the first row (for displaying the next image frame), the third pixel may maintain the image signal received during the third clock period and make the user to observe the correct images. Therefore, even if image signals are inputted into a certain pixel in different clock periods, the previous image signal can be rapidly covered by the correct image signal, and thus, the correct display is not notably disadvantageously influenced.

According to the above-mentioned description, in the embodiment, with the gate driving circuit formed on an array substrate, the shift register units of one shift register can be divided into three groups that are driven separately so as to generate gate driving signals. Accordingly, as compared with the gate driving circuits attached to the array substrate, the cost can be decreased, and especially, the size of a circuit board can be reduced and a degree of slimness is improved.

With reference to the above mentioned description and FIGS. 1 through 3, those skilled in the art can understand a method of driving other gate lines and pixels (including those not shown in the accompany drawings) and the structure of other shift registers (not shown in the accompany drawings), so the detailed description is omitted.

Hereinafter, a circuit structure of a shift register unit according to embodiments of the present invention will be explained in detail.

Figure 4:
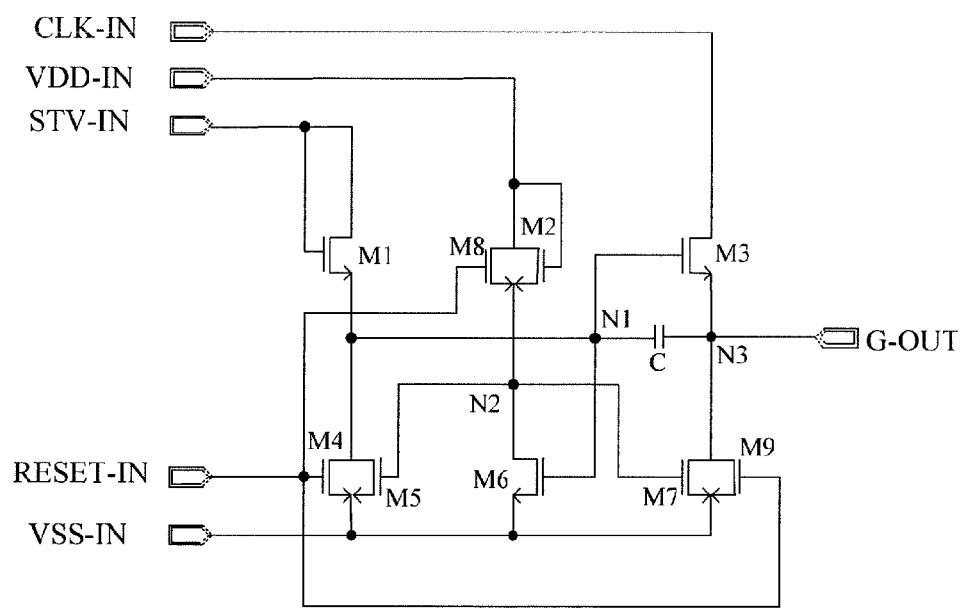
FIG. 4 is a circuit diagram of a shift register unit according to an embodiment.

FIG. 4 is a circuit diagram of the shift register unit according to an embodiment of the present invention. As shown in FIG. 4, a shift register unit according to the embodiment comprises a first through ninth thin film transistors M1-M9, a capacitor C, a start voltage timing signal input terminal STV-IN, a clock signal input terminal CLK-IN, a high level input terminal VDD-IN, a low level input terminal VSS-IN, a reset signal input terminal RESET-IN and a signal output terminal G-OUT.

The gate and the source of the first thin film transistor M1 are connected to the start voltage timing signal input terminal STV-IN, and the drain thereof is connected to a first node N1; the gate and the source of the second thin film transistor M2 are connected to the high level input terminal VDD-IN, and the drain thereof is connected to a second node N2; the gate of the third thin film transistor M3 is connected to the first node N1, the source thereof is connected to the clock signal input terminal CLK-IN, and the drain thereof is connected to a third node N3; the gate of the fourth thin film transistor M4 is connected to the reset signal input terminal RESET-IN, the source thereof is connected to the first node N1, and the drain thereof is connected to the low level input terminal VSS-IN; the gate of the fifth thin film transistor M5 is connected to the second node N2, the source thereof is connected to the first node N1, and the drain thereof is connected to the low level input terminal VSS-IN; the gate of the sixth thin film transistor M6 is connected to the first node N1, the source thereof is connected to the second node N2, and the drain thereof is connected to the low level input terminal VSS-IN; the gate of the seventh thin film transistor M7 is connected to the second node N2, the source thereof is connected to the third node N3, and the drain thereof is connected to the low level input terminal VSS-IN; the gate of the eighth thin film transistor M8 is connected to the reset signal input terminal RESET-IN, the source thereof is connected to the high level input terminal VDD-IN, and the drain thereof is connected to the second node N2; the gate of the ninth thin film transistor M9 is connected to the reset signal input terminal RESET-IN, the source thereof is connected to the third node N3, and the drain thereof is connected to the low level input terminal VSS-IN; and the capacitor C is provided between the third node N3 and the first node N1, and the third node N3 is connected to the signal output terminal G-OUT.

The operating mechanism of the above circuit is explained in the following.

When the start voltage timing signal input terminal is at a high level, the first thin film transistor is turned on, the first node is charged; then correspondingly, the third thin film transistor and the sixth thin film transistor are turned on, and the second node is discharged so that the fifth thin film transistor and the seventh thin film transistor cannot be turned on. At this time, because the clock signal input terminal is at a low level, the low level signal is transmitted through the third thin film transistor and is outputted from the signal output terminal via the third node.

When the start voltage timing signal input terminal is changed to a low level and the clock signal input terminal is at a high level, although the first thin film transistor is turned off, the first node bootstraps and the voltage is at least doubled, and thus, the third thin film transistor is still turned on, and the high level signal from the clock signal input terminal is outputted from the signal output terminal through the third thin film transistor.

When the clock signal input terminal is changed to a low level and the reset signal input terminal is at a high level, the fourth, eighth and ninth thin film transistors are turned on, so that the first node, the third node and the second node are discharged, and thus the low level signals are outputted.

Thus, any signal may be reproduced completely. In addition, in the embodiment, the first node bootstraps to charge continuously so that during the period of the clock signal input terminal at the high level, signals can be completely outputted.

It should be pointed out that the shift register unit shown in FIG. 1 may employ the configuration shown in FIG. 4 or other structures as long as the function of the shift register unit meets the requirement. The shift register unit should comprise at least the start voltage timing signal terminal, the output signal terminal and the timing control signal terminal.

It should be noted that, the embodiments described above are intended to illustrate but not limit the present invention; Although the present invention has been described in detail herein with reference to the above mentioned embodiments, it should be understood by those skilled in the art that the present invention can be modified and some of the technical features can be equivalently substituted without departing from the spirit and scope of the present invention.

What is claimed is:

1. A shift register on an array substrate, comprising:
   a plurality of shift register units each connected to respective one of gate lines of the array substrate,
   wherein the plurality of shift register units are divided into three groups: a first group comprising the (8$n$+1)th and (8$n$+5)th shift register units corresponding to the (8$n$+1)th and (8$n$+5)the gate lines, a second group comprising the (8$n$+3)th and (8$n$+7)th shift register units corresponding to the (8$n$+3)th and (8$n$+7)th gate lines, and a third group comprising the (8$n$+2)th, (8$n$+4)th, (8$n$+6)th and (8$n$+8)th shift register units corresponding to the (8$n$+2)th, (8$n$+4)th, (8$n$+6)th and (8$n$+8)th gate lines, where n is 0 or a positive integer;
   wherein as to any two adjacent shift register units of each group, a signal output terminal of the following shift register unit is connected to a reset signal input terminal of the preceding shift register unit, and a signal output terminal of the preceding shift register unit is connected to a start voltage timing signal input terminal of the following shift register unit;
   wherein each group of shift register units are controlled by two clock signals, and the two clock signals alternately control two adjacent shift register units of each group; and
   wherein both the first shift register unit and the third shift register unit are connected to a first start voltage timing signal input terminal, and the second shift register unit is connected to a second start voltage timing signal input terminal.

2. The shift register according to claim 1, wherein the shift register is directly formed on the array substrate.

3. The shift register according to claim 1, wherein each shift register unit comprises a first through ninth thin film transistors, a capacitor, a start voltage timing signal input terminal, a clock signal input terminal, a high level input terminal, a low level input terminal, a reset signal input terminal and a signal output terminal,
   wherein both a gate and a source of the first thin film transistor are connected to the start voltage timing signal input terminal and a drain thereof is connected to a first node;
   both a gate and a source of the second thin film transistor are connected to the high level input terminal and a drain thereof is connected to a second node;
   a gate of the third thin film transistor is connected to the first node, a source thereof is connected to the clock signal input terminal and a drain thereof is connected to a third node;
   a gate of the fourth thin film transistor is connected to the reset signal input terminal, a source thereof is connected to the first node and a drain thereof is connected to the low level input terminal;
   a gate of the fifth thin film transistor is connected to the second node, a source thereof is connected to the first node and a drain thereof is connected to the low level input terminal;
   a gate of the sixth thin film transistor is connected to the first node, a source thereof is connected to the second node and a drain thereof is connected to the low level input terminal;
   a gate of the seventh thin film transistor is connected to the second node, a source thereof is connected to the third node and a drain thereof is connected to the low level input terminal;
   a gate of the eighth thin film transistor is connected to the reset signal input terminal, a source thereof is connected to the high level input terminal and a drain thereof is connected to the second node;
   a gate of the ninth thin film transistor is connected to the reset signal input terminal, a source thereof is connected to the third node and a drain thereof is connected to the low level input terminal; and
   a capacitor is disposed between the third node and the first node and the third node is connected to the signal output terminal.

4. An array substrate, comprising the shift register according to claim 1.

5. The array substrate according to claim 1, wherein the shift register is directly formed on the array substrate.

6. The array substrate according to claim 4, wherein the shift register unit comprises a first through ninth thin film transistors, a capacitor, a start voltage timing signal input terminal, a clock signal input terminal, a high level input terminal, a low level input terminal, a reset signal input terminal and a signal output terminal, and
   wherein both a gate and a source of the first thin film transistor are connected to the start voltage timing signal input terminal and a drain thereof is connected to a first node;
   both a gate and a source of the second thin film transistor are connected to the high level input terminal and a drain thereof is connected to a second node;
   a gate of the third thin film transistor is connected to the first node, a source thereof is connected to the clock signal input terminal and a drain thereof is connected to a third node;

a gate of the fourth thin film transistor is connected to the reset signal input terminal, a source thereof is connected to the first node and a drain thereof is connected to the low level input terminal;

a gate of the fifth thin film transistor is connected to the second node, a source thereof is connected to the first node and a drain thereof is connected to the low level input terminal;

a gate of the sixth thin film transistor is connected to the first node, a source thereof is connected to the second node and a drain thereof is connected to the low level input terminal;

a gate of the seventh thin film transistor is connected to the second node, a source thereof is connected to the third node and a drain thereof is connected to the low level input terminal;

a gate of the eighth thin film transistor is connected to the reset signal input terminal, a source thereof is connected to the high level input terminal and a drain thereof is connected to the second node;

a gate of the ninth thin film transistor is connected to the reset signal input terminal, a source thereof is connected to the third node and a drain thereof is connected to the low level input terminal; and a capacitor is disposed between the third node and the first node and the third node is connected to the signal output terminal.

7. The array substrate according to claim 4, wherein the array substrate comprises i gate lines and j data lines, and two branch-data lines $Dj1$ and $Dj2$ are branched from each data line, where i and j both are positive integers;

wherein pixels at the i-th row are formed corresponding to the gate lines $2i-1$ and $2i$, each data line j defines four pixels at the i-th row, comprising pixels $i(4j-3)$ and $i(4j-2)$ corresponding to the branch-data line $Dj1$ and pixels $i(4j-1)$ and $i(4j)$ corresponding to the branch-data line $Dj2$.

8. The array substrate according to claim 7, wherein the pixel $i(4j-3)$ comprises a first switching device that allows image signals from the branch-data line $Dj1$ to be inputted into this pixel only when the gate line $2i-1$ and the gate line $2i+1$ provide simultaneously high level driving signals, and the first switching device is electrically connected to the gate line $2i-1$, the gate line $2i+1$ and the branch-data line $Dj1$;

the pixel $i(4j-2)$ comprises a second switching device that allows image signals from the branch-data line $Dj1$ to be inputted into this pixel only when the gate line $2i$ and the gate line $2i+1$ provide simultaneously high level driving signals, and the second switching device is electrically connected to the gate line $2i$, the gate line $2i+1$ and the branch-data line $Dj1$;

the pixel $i(4j-1)$ comprises a third switching device that allows image signals from the branch-data line $Dj2$ to be inputted into this pixel only when the gate line $2i-1$ provides high level driving signal, and the third switching device is electrically connected to the gate line $2i-1$ and the branch-data line $Dj2$; and the pixel $i(4j)$ at the first row comprises a fourth switching device that allows image signals from the branch-data line $Dj2$ to be inputted into this pixel only when the gate line $2i$ provides high level driving signal, and the fourth switching device is electrically connected to the gate line $2i$ and the branch-data line $Dj2$.

* * * * *